United States Patent [19]
Hamada

[11] Patent Number: 5,802,000
[45] Date of Patent: Sep. 1, 1998

[54] HIGHLY INTEGRATED SEMICONDUCTOR DEVICE HAVING STEPWISE BIT LINES

[75] Inventor: Takehiko Hamada, Tokyo, Japan

[73] Assignee: NEC Corporation, Tokyo, Japan

[21] Appl. No.: 909,782

[22] Filed: Aug. 12, 1997

Related U.S. Application Data

[63] Continuation of Ser. No. 496,417, Jun. 29, 1995, abandoned.

[30] Foreign Application Priority Data

Jun. 30, 1994 [JP] Japan ..................... 6-170474

[51] Int. Cl.$^6$ ..................................... G11C 7/00
[52] U.S. Cl. ................... 365/205; 365/63; 365/72
[58] Field of Search ................. 365/63, 72, 205, 365/208, 230.03; 257/773

[56] References Cited

U.S. PATENT DOCUMENTS

| | | | |
|---|---|---|---|
| 4,914,502 | 4/1990 | Lebowitz | 257/773 |
| 5,194,752 | 3/1993 | Kumagai et al. | 365/63 |
| 5,214,601 | 5/1993 | Hidaka et al. | 365/63 |
| 5,272,665 | 12/1993 | Uesugi | 365/208 |
| 5,280,443 | 1/1994 | Hidaka et al. | 365/72 |
| 5,315,542 | 5/1994 | Melzner | 365/72 |
| 5,396,450 | 3/1995 | Takashima et al. | 365/63 |
| 5,396,451 | 3/1995 | Ema | 365/72 |
| 5,416,734 | 5/1995 | Hidaka et al. | 365/63 |
| 5,418,737 | 5/1995 | Tran | 365/228 |
| 5,457,648 | 10/1995 | Eisig | 365/63 |
| 5,475,643 | 12/1995 | Ohta | 365/63 |
| 5,499,205 | 3/1996 | Ahn et al. | 365/72 |

FOREIGN PATENT DOCUMENTS 4279055  10/1992  Japan.

*Primary Examiner*—A. Zarabian
*Attorney, Agent, or Firm*—Whitham, Curtis & Whitham

[57] ABSTRACT

In a semiconductor memory device, a plurality of straight word lines are arranged in parallel with each other, and a plurality of stepwise bit lines are arranged approximately perpendicular to the word lines. A plurality of memory cells of a one-transistor, one-capacitor type are connected between the word lines and the bit lines.

14 Claims, 14 Drawing Sheets

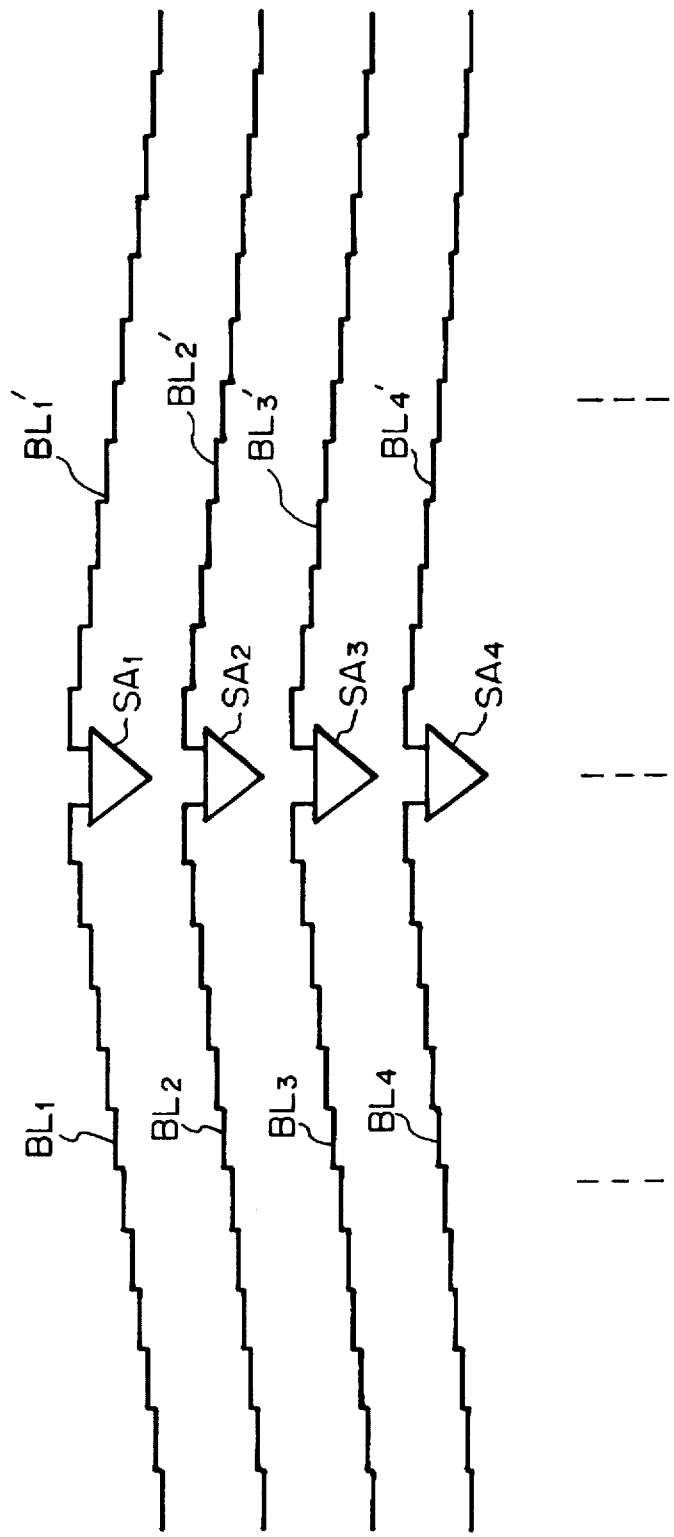

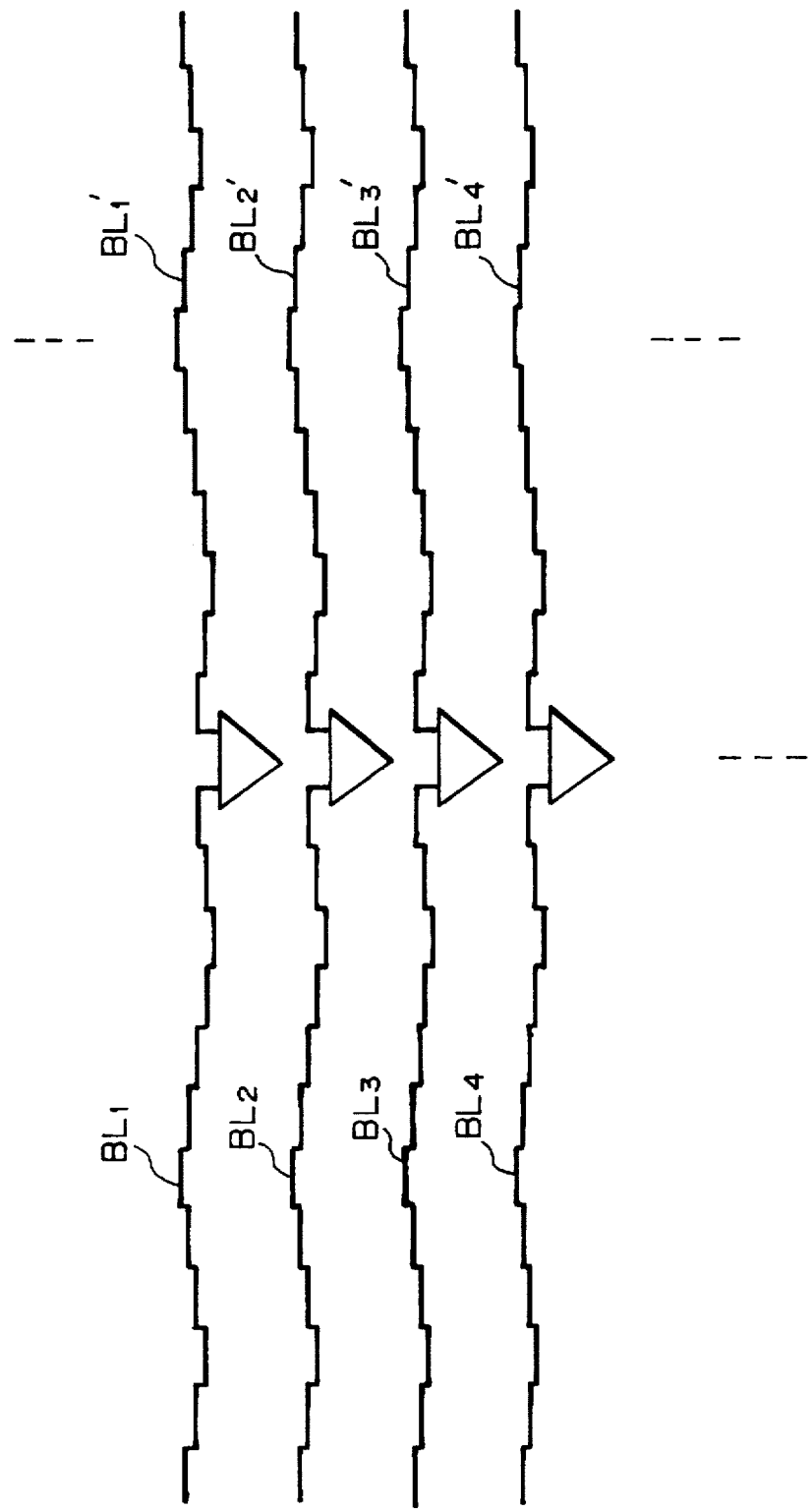

5,802,000

HIGHLY INTEGRATED SEMICONDUCTOR DEVICE HAVING STEPWISE BIT LINES

RELATED APPLICATIONS

This application is a continuation of U.S. patent application Ser. No. 08/496,417, filed on Jun. 29, 1995, now abandoned.

BACKGROUND OF THE INVENTION

1. Field of the Invention

The present invention relates to a semiconductor memory device, and more particularly, to a dynamic random access memory (DRAM) device having memory cells of a one-transistor, one-capacitor type.

2. Description of the Related Art

Generally, a DRAM device includes a plurality of word lines, a plurality of bit lines, and a plurality of memory cells each connected to one of the word lines and one of the bit lines. In this case, the memory cells are of a one-transistor, one-capacitor type.

In order to enhance the integration, in a prior art DRAM device (see: JP-A-HEI4-279055), the bit lines are sloped in relation to the word lines. This will be explained later in detail.

In the above-described prior art DRAM device, however, the integration is still low.

SUMMARY OF THE INVENTION

It is an object of the present invention to further enhance the integration of a DRAM device.

According to the present invention, in a semiconductor memory device, a plurality of straight word lines are arranged in parallel with each other, and a plurality of stepwise bit lines are arranged approximately perpendicular to the word lines. A plurality of memory cells of a one-transistor, one-capacitor type are connected between the word lines and the bit lines.

The stepwise bit line configuration enhances the integration.

BRIEF DESCRIPTION OF THE DRAWINGS

The present invention will be more clearly understood from the description as set forth below, as compared with the prior art, with reference to the accompanying drawings, wherein:

FIG. 10B is a diagram illustrating the bit lines of FIG. 10A;

FIG. 12B is a diagram illustrating the bit lines of FIG. 11A.

DESCRIPTION OF THE PREFERRED EMBODIMENTS

Figure 3A:
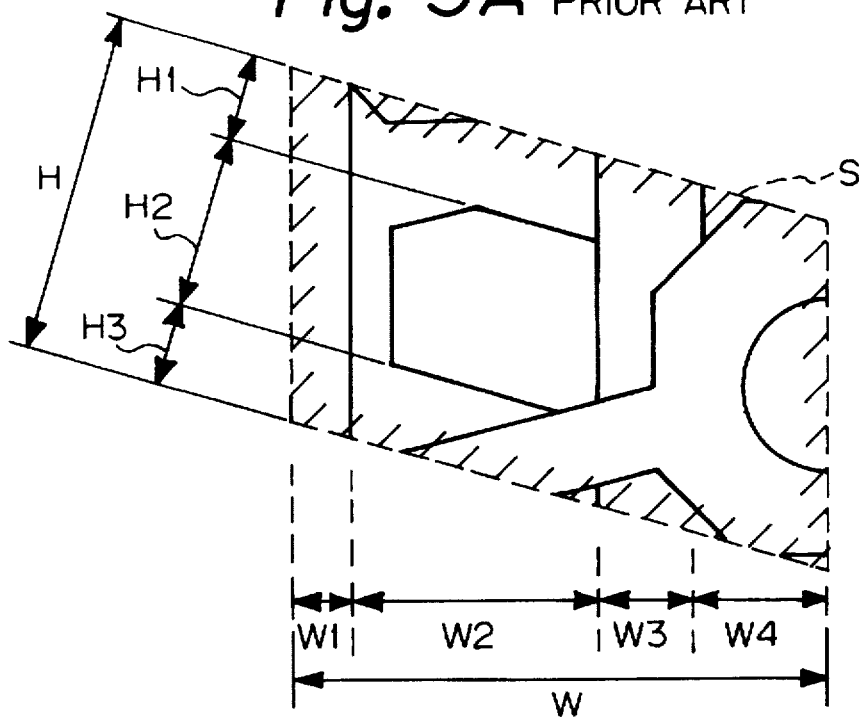
FIGS. 3A and 3B are diagrams illustrating an area per one memory cell of the device of FIG. 1.
Figure 4:
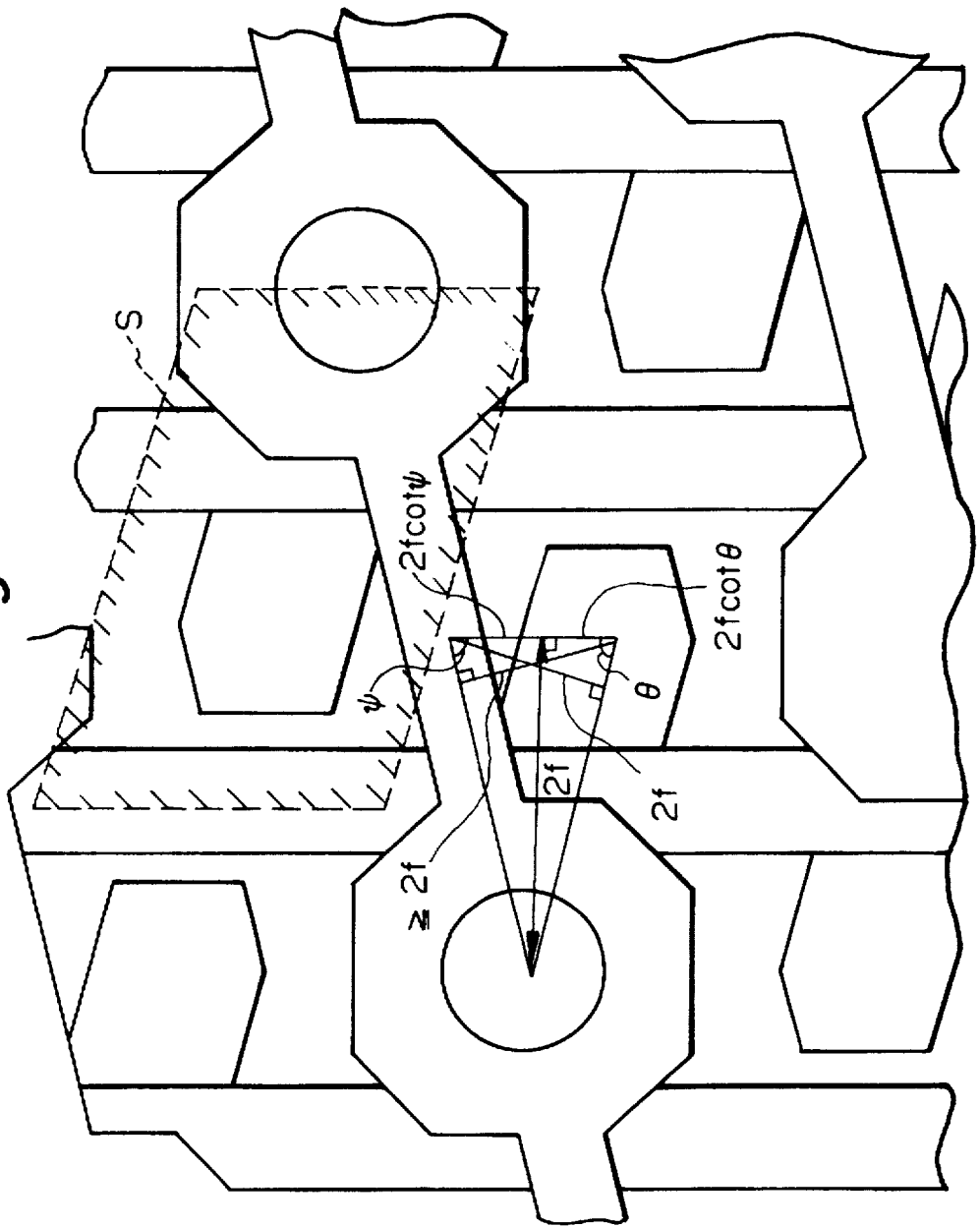
FIG. 4 is an enlarged partial plan view of the device of FIG. 1.
Figure 5:
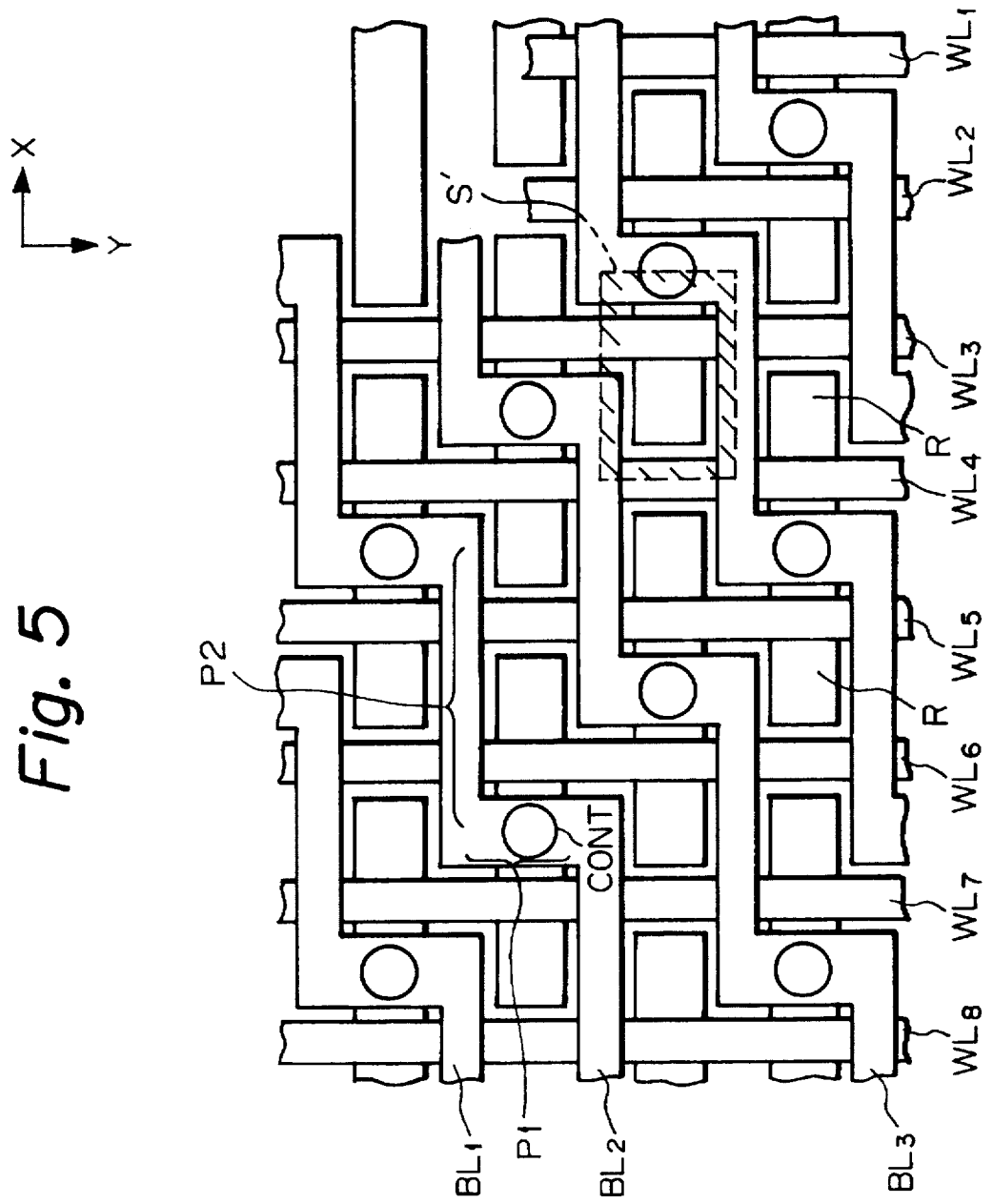
FIG. 5 is a plan view illustrating a first embodiment of the DRAM device according to the present invention.

Before the description of the preferred embodiments, a prior art DRAM device will be explained with reference to FIGS. 1, 2, 3 and 4 (see: FIG. 5 of JP-A-HEI4-279055).

Figure 1:
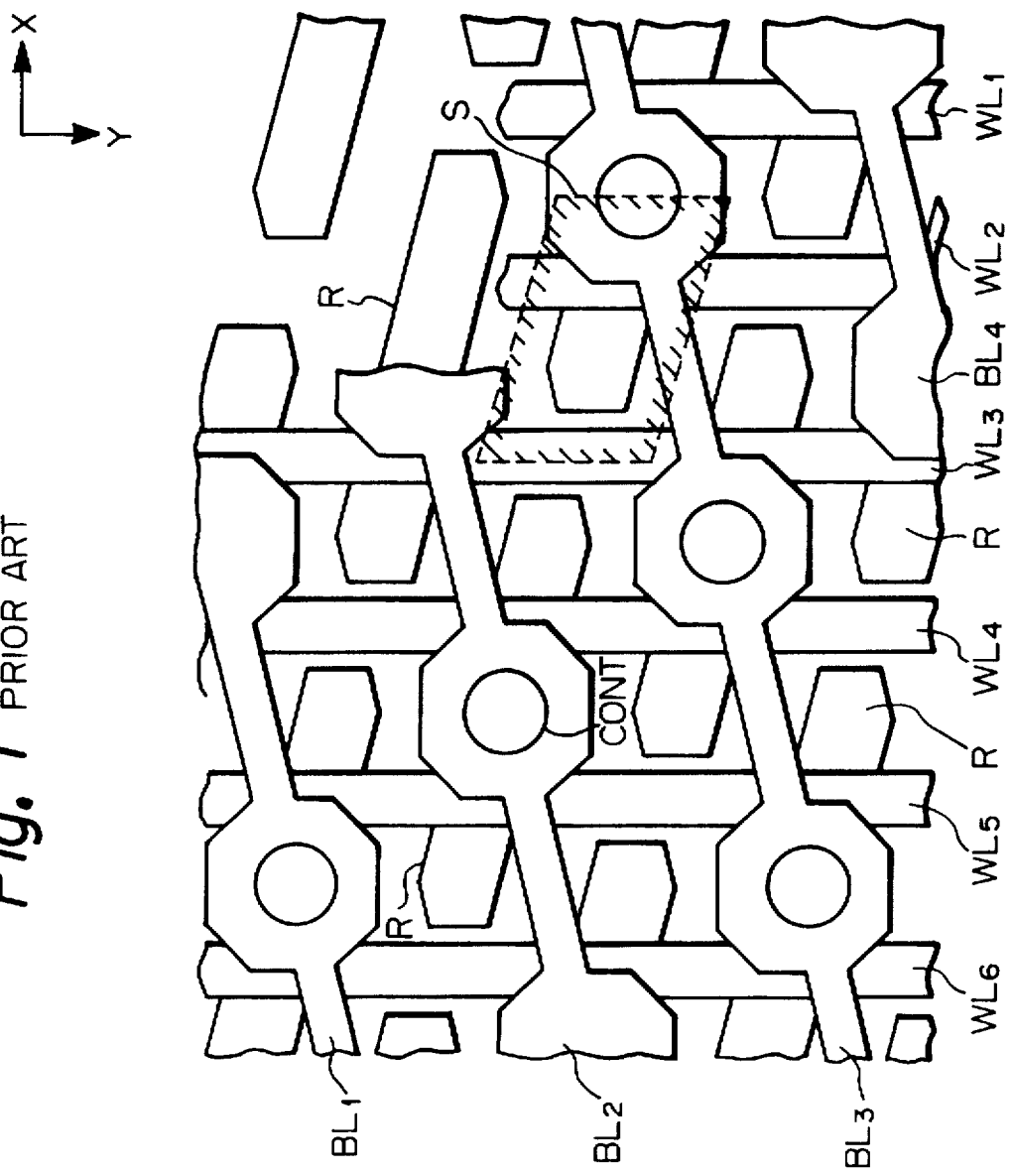
FIG. 1 is a plan view illustrating a prior art DRAM device.

In FIG. 1, which is a plan view of the prior art DRAM device, a plurality of word lines $WL_1, WL_2, \ldots$ made of polycrystalline silicon are arranged in parallel with each other along a Y direction, while a plurality of bit lines $BL_1, BL_2, \ldots$ made of tungsten silicide are arranged in parallel with each other but are sloped in relation to an X direction.

Also, an element forming region R is sloped in the X direction and the Y direction. The element forming region R has two source regions connected to two capacitors (shown not in FIG. 1, but in FIG. 2), a drain region connected via a contact hole CONT to one of the bit lines such as $BL_1$, and two channel regions over which two of the word lines such as $WL_4$ and $WL_5$ are located. That is, two memory cells are formed in one element forming region R.

Figure 2:
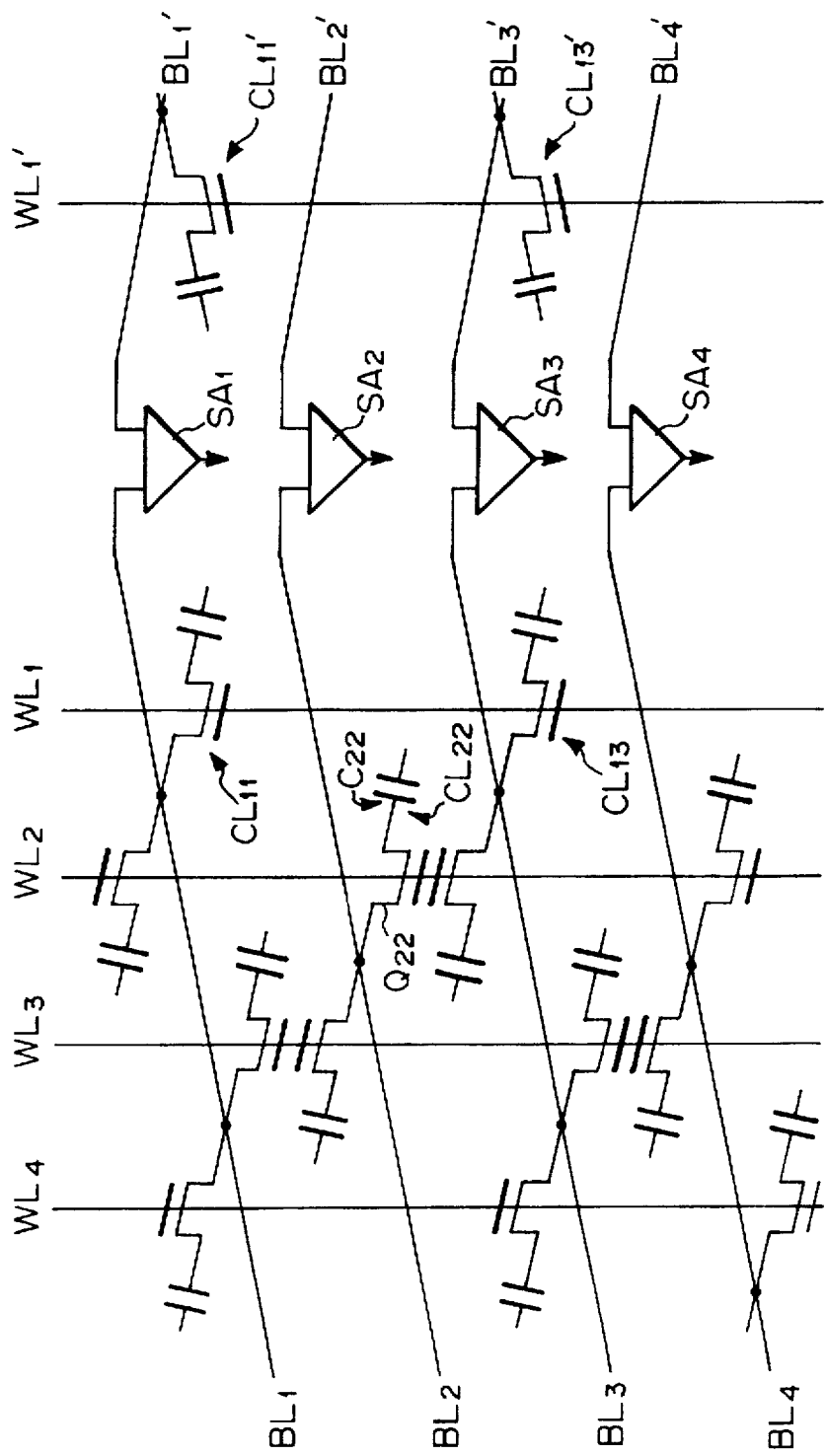
FIG. 2 is an equivalent circuit diagram of the device of FIG. 1.

As illustrated in FIG. 2, which illustrates an equivalent circuit diagram of the DRAM device of FIG. 1, a memory cell $CL_{ij}$ (i, j=1, 2, . . . ) is provided at an intersection between one of the word lines $WL_1, WL_2, \ldots$ and one of the bit lines $BL_1, BL_2, \ldots$ In this case, the memory cells $CL_{11}, CL_{13}, \ldots$ are provided for every two word lines and for every two bit lines.

Also, the bit lines $BL_1, BL_2, \ldots$ are connected to sense amplifiers $SA_1, SA_2, \ldots$ respectively. Also, bit lines $BL_1', BL_2', \ldots$ are connected to the sense amplifiers $SA_1, SA_2, \ldots$ Further, memory cells are $CL_{11}', CL_{13}', \ldots$ provided at intersections between the bit lines $BL_1', BL_2', \ldots$ and word lines $BL_1', BL_2', \ldots$ Thus, the DRAM device as illustrated in FIGS. 1 and 2 can be of an open bit line type.

A parallelogram area S per one memory cell is calculated as follows. As illustrated in FIG. 3A, a height H of the parallelogram is represented by $$H = H1 + H2 + H3 \qquad (1)$$

where

H1 is half of a width of one isolation region;

H2 is a width of one element forming region R; and

H3 is half of the width of one isolation region.

If the width of the isolation region and the element forming region R are both a minimum length f, then the formula (1) is replaced by $$H = f/2 + f + f/2 \qquad (2)$$
$$= 2f$$

Also, as illustrated in FIG. 3A, a width W of the parallelogram is represented by $$W = W1 + W2 + W3 + W4 \quad (3)$$

where

W1 is half of the width of one word line;

W2 is the width of one capacitor contact hole forming region;

W3 is a width of one word line; and

W4 is a half of a width of a contact region.

If the width of one word line is the minimum length f, and a sum of W2 and W4 is the minimum length f, the formula (3) is replaced by $$\begin{aligned} W &= f/2 + f + f + f/2 \\ &= 3f \end{aligned} \quad (4)$$

Figure 3B:
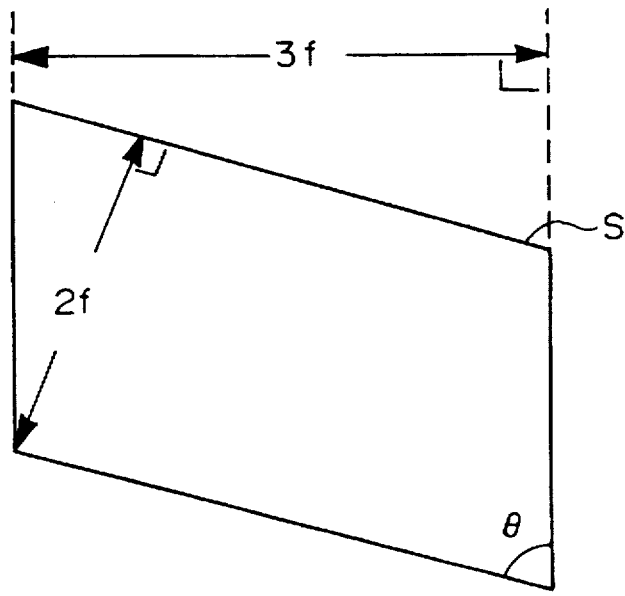

Therefore, for the parallelogram illustrated in FIG. 3B, the area S thereof is $$S = 6f^2 / \sin\theta \quad (5)$$

where θ is an acute angle of the parallelogram.

The minimum value of the area S will be explained next with reference to FIG. 4. That is, if a pitch of the word lines is 2f, $$2f(\cot\theta + \cot\phi)\sin\theta = f \quad (6)$$

$$2f(\cot\theta + \cot\phi)\sin\phi \geq f \quad (7)$$

Therefore, from the formula (6), $$\cot\phi = (1 - 2\cos\theta)/(2\sin\theta)$$

$$\therefore \sin\phi = 2 \cdot \sin\theta / \sqrt{5 - 4\cos\theta}$$

Also, from the formula (7), $$4/\sqrt{5 - \cos\theta} \geq 1 \quad (8)$$

$$\therefore \cos\theta \geq 1/4$$

Thus, when $\cos\theta = 1/4$, i.e., $\theta = 75.5°$, the area S is $$\begin{aligned} S &= 6f^2/(\sqrt{15}/4) \\ &= 6.2f^2 \end{aligned} \quad (9)$$

In other words, when an angle between the bit lines and the element forming regions is about 29°, the integration is maximum.

In FIG. 5, which illustrates a first embodiment of the present invention, the bit lines $BL_1$, $BL_2$, ... are arranged stepwise along the X direction. In more detail, each of the bit lines $BL_1$, $BL_2$, ... includes first portions P1 including the contact hole CONT in parallel with the Y direction and second portions P2 in parallel with the X direction. Also, the element forming region R is in parallel with the X direction.

Figure 6:
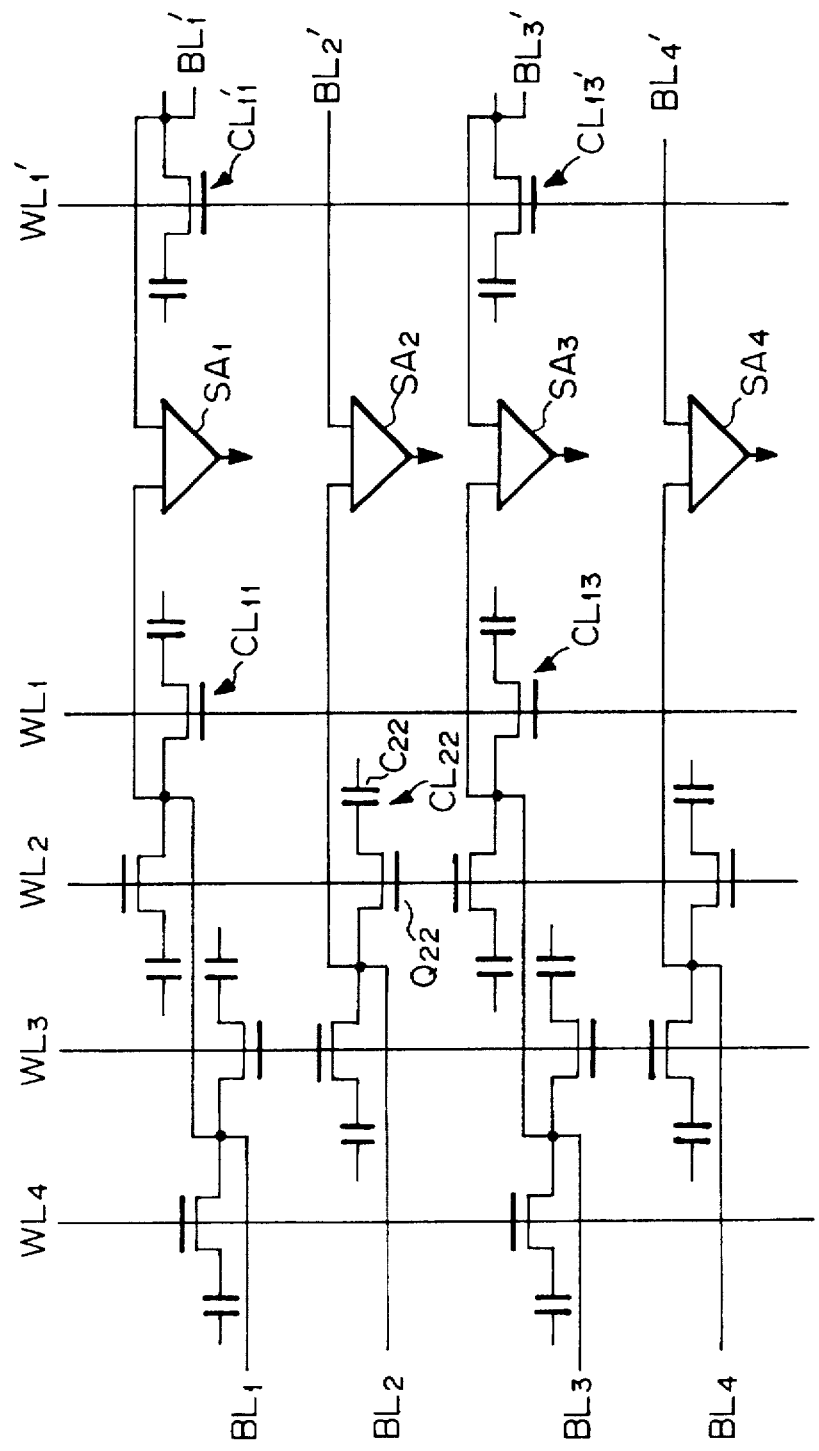
FIG. 6 is an equivalent circuit diagram of the DRAM device of FIG. 5.

As illustrated in FIG. 6, which illustrates an equivalent circuit diagram of the DRAM device of FIG. 5, the bit lines $BL_1$, $BL_2$, ... and the bit lines $BL_1'$, $BL_2'$, ... are arranged stepwise.

In FIG. 5, an area S' per one memory cell is rectangular. Therefore, the rectangular area S' is calculated by putting a condition θ=90° into the formula (5):

$$S' = 6f^2 \quad (10)$$

Thus, the integration of the DRAM device of FIG. 5 can be enhanced as compared with that of the DRAM device of FIG. 1.

The method for manufacturing the DRAM device of FIG. 5 will be explained next with reference to FIGS. 7A through 7E.

Figure 7A:
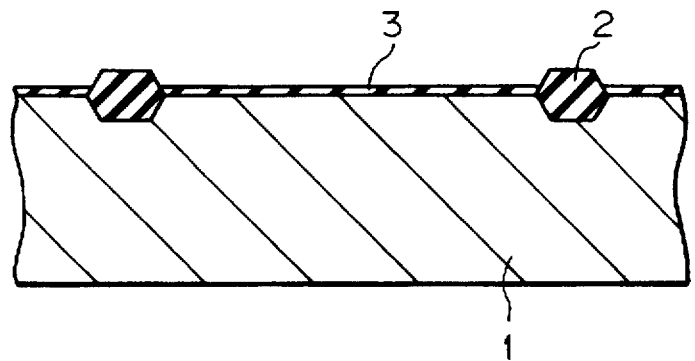
FIGS. 7A through 7E are cross-sectional views for explaining a method for manufacturing the device of FIG. 5.

First, referring to FIG. 7A, a local oxidation of silicon (LOCOS) is performed upon a P-type monocrystalline silicon substrate 1 with a mask of a silicon nitride layer (not shown), to create a thick silicon oxide layer 2. Then, a gate silicon oxide layer 3 is grown by thermally oxidizing the silicon substrate 1.

Figure 7B:
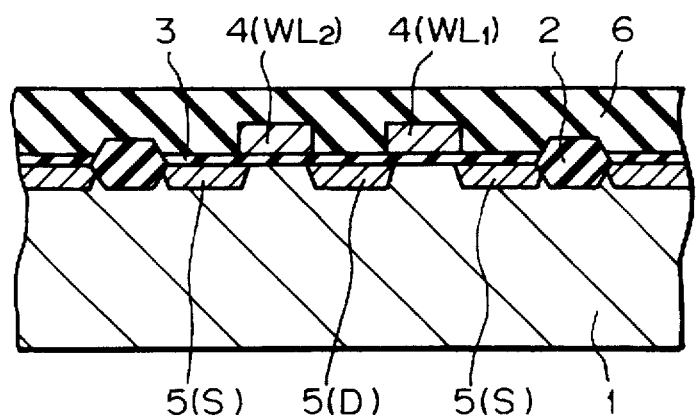

Next, referring to FIG. 7B, an N-type impurity doped polycrystalline silicon layer is deposited by a chemical vapor deposition (CVD) process and is patterned to form gate electrodes 4 (i.e., the word lines $WL_1$ and $WL_2$). Then, N-type impurities are doped into the silicon substrate 1 with a mask of the gate electrodes 4 and the thick silicon oxide layer 2, to create N-type impurity regions 5 (i.e., the drain region D and the source regions S) within the silicon substrate 1. Then, a silicon oxide layer 6 is deposited on the entire surface by a CVD process.

Figure 7C:
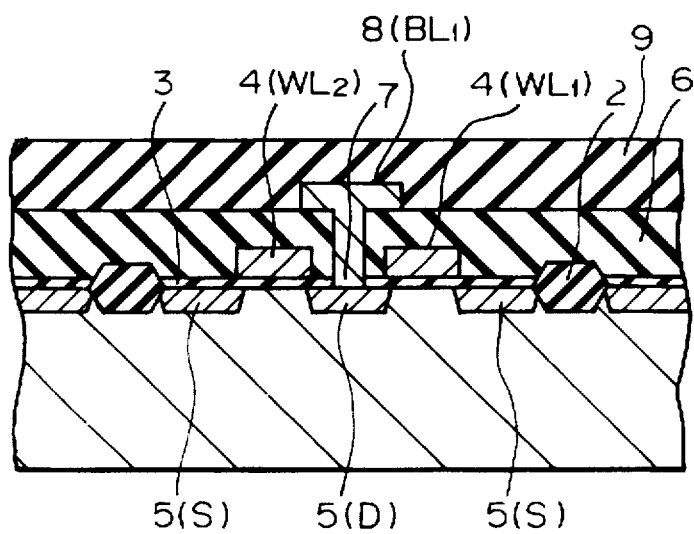

Next, referring to FIG. 7C, a contact hole 7 is perforated in the silicon oxide layer 6 by a photolithography and dry etching process. Then, tungsten silicide is deposited, and thereafter, the tungsten silicide is patterned and is left in the contact hole 7, thus forming a tungsten silicide layer 8 (i.e., the bit line $BL_1$). Then, a silicon oxide layer 9 is deposited on the entire surface by a CVD process.

In FIG. 7C, note that the tungsten silicide layer 8 (the bit line $BL_1$) is arranged in parallel with the gate electrodes 4 (the word lines $WL_1$ and $WL_2$), and therefore, the bit line $BL_1$ is not superposed onto the N-type impurity regions 5 (the source regions S).

Figure 7D:
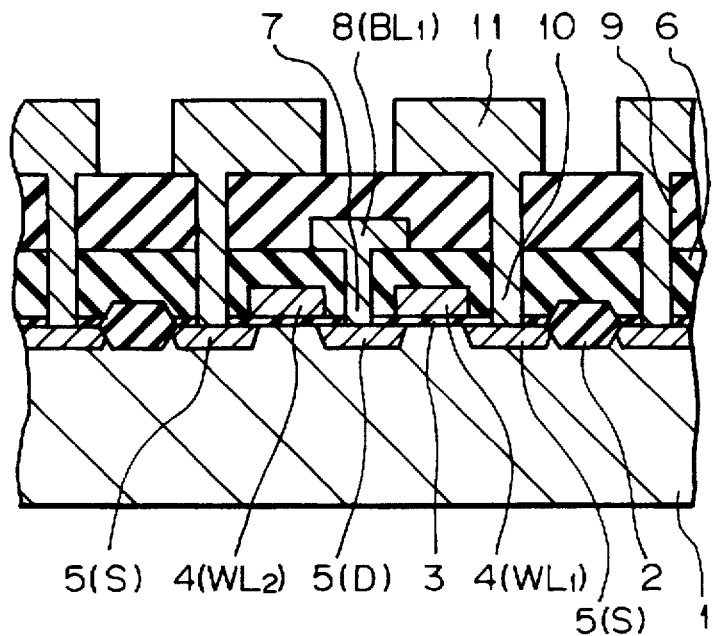

Next, referring to FIG. 7D, a contact hole 10 is perforated in the silicon oxide layers 9 and 6 by a photohithography and dry etching process. Then, lower capacitor electrodes 11 made of N-type impurity doped polycrystalline silicon are formed by a CVD process and a photolithography and dry etching process.

Figure 7E:
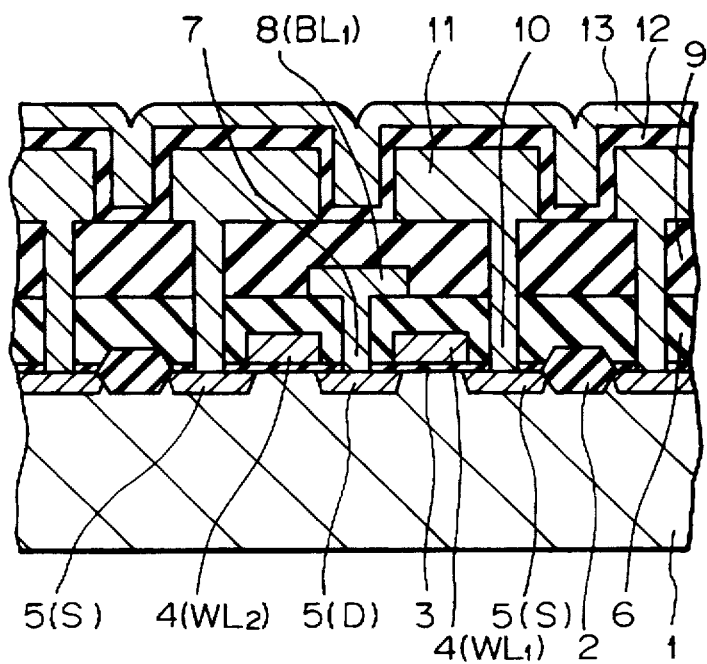

Finally, referring to FIG. 7E, a capacitor insulating layer 12 made of silicon oxide is deposited by a CVD process. Then, a capacitor upper electrode 13 made of N-type impurity doped polycrystalline silicon is deposited by a CVD process. Thus, the capacitor comprising upper electrode 13, lower electrode 11, and insulation layer 12 is formed over the bit line 8 (BL1). Then, insulating layer and an aluminum connection layer (not shown) are formed to complete the device of FIG. 5.

Figure 8:
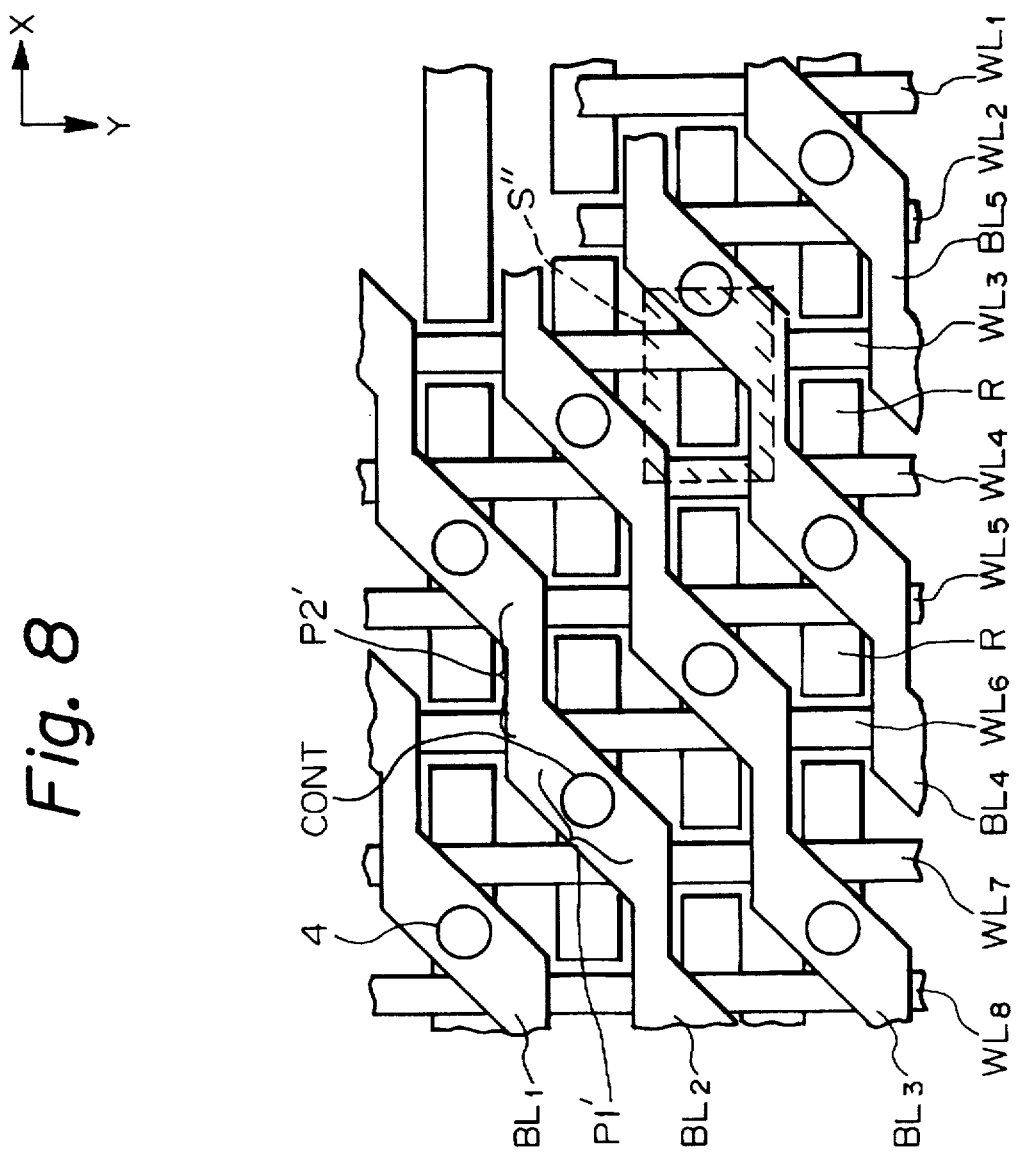
FIG. 8 is a plan view illustrating a second embodiment of the DRAM device according to the present invention.

In FIG. 8, which illustrates a second embodiment of the present invention, the bit lines $BL_1$, $BL_2$, ... are also arranged stepwise along the X direction. In more detail, each of the bit lines $BL_1$, $BL_2$, ... includes first portions P1' including the contact hole CONT sloped in the Y direction and second portions P2' in parallel with the X direction. Also, the element forming region R is in parallel with the X direction.

Figure 9:
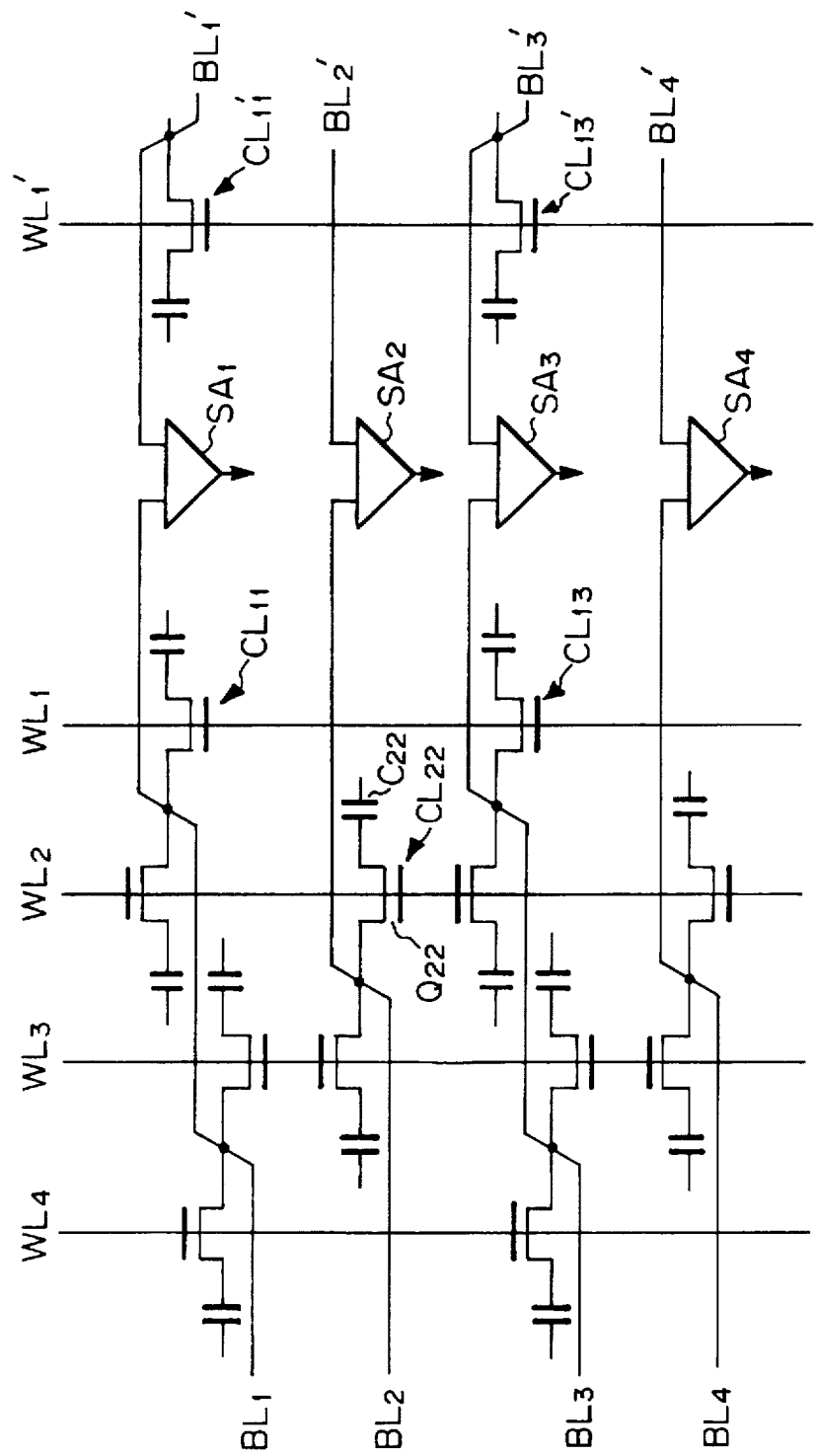
FIG. 9 is an equivalent circuit diagram of the DRAM device of FIG. 8.

As illustrated in FIG. 9, which illustrates an equivalent circuit diagram of the DRAM device of FIG. 8, the bit lines $BL_1$, $BL_2$, ... and the bit lines $BL_1'$, $BL_2'$, ... are arranged stepwise with the sloped portions P1'.

In FIG. 8, an area S" per one memory cell is also rectangular. Therefore, the rectangular area S" is also calculated by putting a condition θ=90° into the formula (5):

$$S'' = 6f^2 \quad (11)$$

Thus, the integration of the DRAM device of FIG. 8 can be also enhanced as compared with that of the DRAM device of FIG. 1.

The manufacturing method of the device of FIG. 8 is similar to that of the device of FIG. 5.

In the second embodiment as illustrated in FIGS. 8 and 9, the bit lines can be reduced in length as compared with those of the first embodiment as illustrated in FIGS. 5 and 6. Therefore, the resistance of the bit lines is reduced. Also, since the space between the bit lines can be large, the capacitance therebetween can be reduced to enhance the resistance characteristics against noise.

Figure 10A:
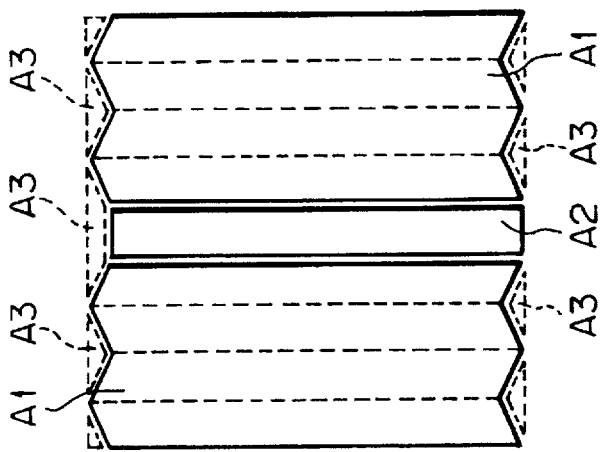
FIG. 10A is a first layout diagram illustrating an entire DRAM including the memory cell array of FIG. 5 or 8.

In FIG. 10A, which is a layout diagram of an entire device including the memory cell array of FIG. 5 or 8, reference A1 designates an area of the memory cell array of FIG. 5 or 8, A2 designates an area of the sense amplifiers $SA_1$, $SA_2$, ... of FIG. 6 or 9, and A3 designates a peripheral area. In this case, the bit lines $BL_1$, $BL_2$, ... are arranged stepwise as illustrated in FIG. 10B. Therefore, since the area A1 is parallelogram, the area A3 is relatively large. Since this area A3 is used for peripheral circuits, the area A3 is preferably as small as possible.

Figure 11A:
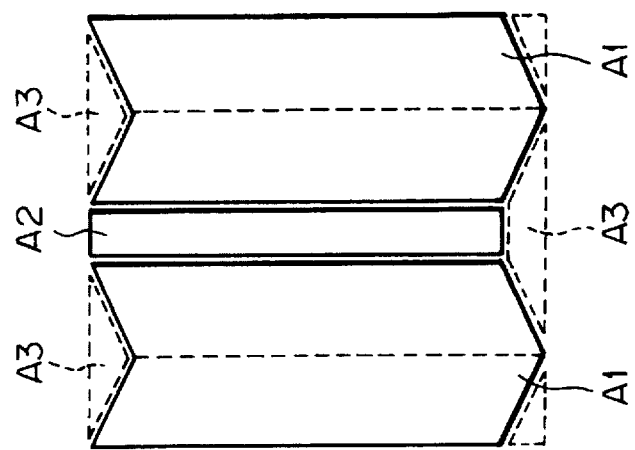
FIG. 11A is a second layout diagram illustrating an entire DRAM including the memory cell array of FIG. 5 or 8.
Figure 12A:
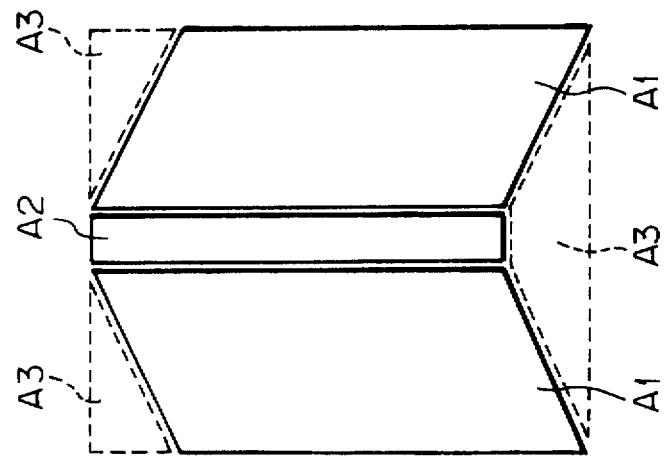
FIG. 12A is a third layout diagram illustrating an entire DRAM including the memory cell array of FIG. 5 or 8.
Figure 11B:
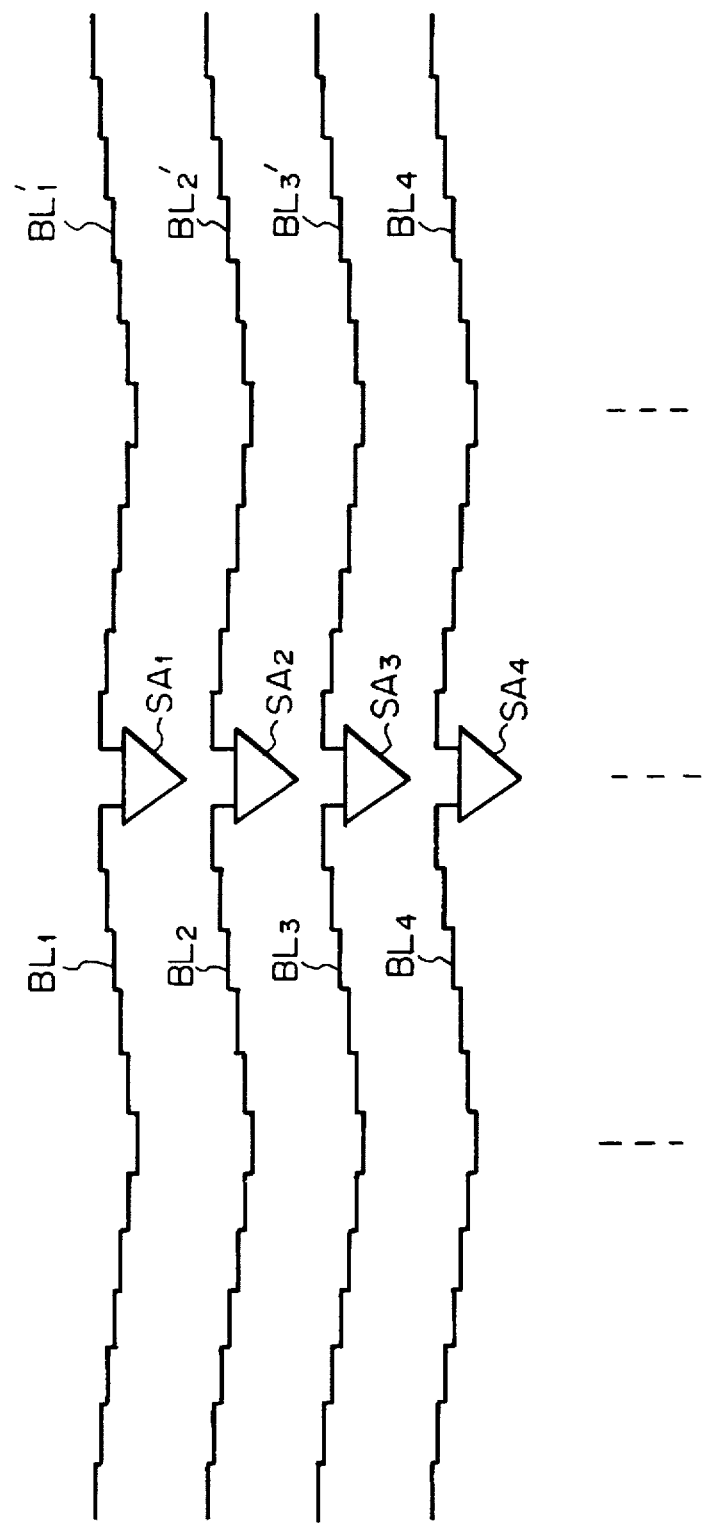
FIG. 11B is a diagram illustrating the bit lines of FIG. 11A.

In order to reduce the area A3, the bit lines $BL_1$, $BL_2$, ... are made zigzag, i.e., staggered. For example, as illustrated in FIGS. 11A and 11B, each of the memory cell arrays A1 is divided into two blocks. Also, as illustrated in FIGS. 12A and 12B, each of the memory cell arrays A1 is divided into four blocks to further reduce the area A3. However, when the number of divided blocks is increased, space between the blocks is increased thus reducing the integration. Therefore, the number of divided blocks is selected at an optimum value in consideration of the area A3 and the space between the divided blocks.

As explained hereinbefore, according to the present invention, since an area per one memory cell is reduced, the integration of the device can be enhanced.

I claim:

1. A semiconductor memory device, comprising:
   a plurality of straight word lines arranged in parallel with each other along a first direction;
   a plurality of open bit line-type bit lines arranged stepwise along a second direction approximately perpendicular to said first direction, said bit lines being entirely sloped in relation to said first and said second directions; and
   a plurality of memory cells each comprising a capacitor and a transistor having a drain connected to one of said plurality of bit lines, a gate connected to one of said plurality of word lines, and a source connected to said capacitor, wherein said capacitor is formed over a corresponding one of said plurality of said bit lines and said bit lines substantially avoid overlapping said source.

2. A device as set forth in claim 1, wherein said bit lines include:
   first portions in parallel with said first direction, each of said first portions being connected to respective ones of said memory cells; and
   second portions in parallel with said second direction.

3. A device as set forth in claim 1, wherein said bit lines include:
   first portions sloped in relation to said first direction, each of said first portions being connected to respective ones of said memory cells; and
   second portions in parallel with said second direction.

4. A device as set forth in claim 1, wherein said bit lines are staggered with respect to one another along said second direction.

5. A semiconductor memory device comprising:
   a plurality of straight word lines arranged in parallel with each other in a first direction;
   a plurality of open bit line-type bit lines arranged stepwise and approximately perpendicular to said word lines in a second direction, wherein said bit lines are entirely sloped in relation to said first and said second directions; and
   a plurality of memory cells each comprising one transistor and one capacitor, each of said memory cells being connected to one of said word lines and to a portion of one bit line of said plurality of bit lines, said portion being approximately parallel to said word lines, wherein said capacitor is formed over said bit line and said bit line substantially avoids overlapping a source of said transistor.

6. A device as set forth in claim 5, wherein said bit lines are staggered with respect to one another.

7. A semiconductor memory device comprising:
   a plurality of sense amplifiers arranged along a first direction;
   a first group of straight word lines arranged in parallel with each other along said first direction on a first side of said sense amplifiers;
   a second group of straight word lines arranged in parallel with each other along said first direction on a second side of said sense amplifiers opposite to said first side thereof;
   a first group of open bit line-type bit lines arranged stepwise along a second direction approximately perpendicular to said first direction, on said first side of said sense amplifiers, said first group of bit lines being connected to said sense amplifiers, and being entirely sloped in relation to said first and second directions;
   a second group of open bit line-type bit lines arranged stepwise along said second direction on said second side of sense amplifiers, said second group bit lines being connected to said sense amplifiers, and being entirely sloped in relation to said first and second directions;
   a first group of memory cells, each connected to one of said first group of straight word lines and to one of said first group of bit lines, wherein said first group of memory cells comprise capacitors positioned over said first group of bit lines and transistors having sources positioned to substantially avoid overlapping said first group of bit lines; and
   a second group of memory cells, each connected to one of said second group of straight word lines and to one of said second group of bit lines, wherein said second group of memory cells comprise capacitors positioned over said second group of bit lines and transistors having sources positioned to substantially avoid overlapping said second group of bit lines.

8. A device as set forth in claim 7, wherein said bit lines include:
   first portions in parallel with said first direction, each of said first portions being connected to respective ones of said memory cells; and
   second portions in parallel with said second direction.

9. A device as set forth in claim 7, wherein said bit lines include:
   first portions sloped in relation to said first direction, each of said first portions being connected to respective ones of said memory cells; and
   second portions in parallel with said second direction.

10. A device as set forth in claim 7, wherein said bit lines are staggered with respect to one another.

11. A semiconductor memory device according to claim 1, wherein an element forming region of said device includes therein first and second memory cells of said plurality of memory, said bit lines being arranged over only a portion of said element forming region.

12. A semiconductor memory device according to claim 5, wherein an element forming region of said device includes therein first and second memory cells of said plurality of memory, said bit lines being arranged over only a portion of said element forming region.

13. A semiconductor memory device according to claim 5, wherein each of said memory cells includes:

a cell transistor having a drain connected to one of said bit lines, a gate connected to one of said word lines, and a source; and a capacitor connected to said source, said capacitor being formed over said bit lines arranged stepwise.

14. A semiconductor memory device according to claim 7, wherein each of said memory cells includes:

a cell transistor having a drain connected to one of said bit lines, a gate connected to one of said word lines, and a source; and a capacitor connected to said source, said capacitor being formed over said bit lines arranged stepwise.

* * * * *